(12) United States Patent
Nam et al.

(10) Patent No.: US 6,983,755 B2
(45) Date of Patent: Jan. 10, 2006

(54) CLEANING METHOD AND CLEANING APPARATUS FOR PERFORMING THE SAME

(75) Inventors: Chang-Hyeon Nam, Gyeonggi-do (KR); Hong-Seong Son, Gyeonggi-do (KR); Kyung-Hyun Kim, Seoul (KR)

(73) Assignee: Samsung Electronics Co., Ltd., (KR)

(*) Notice: Subject to any disclaimer, the term of this patent is extended or adjusted under 35 U.S.C. 154(b) by 187 days.

(21) Appl. No.: 10/281,707

(22) Filed: Oct. 28, 2002

(65) Prior Publication Data
US 2003/0098040 A1 May 29, 2003

(30) Foreign Application Priority Data
Nov. 27, 2001 (KR) ................. 2001-74311

(51) Int. Cl.
*B08B 3/00* (2006.01)
(52) U.S. Cl. ............. 134/147; 134/95.3; 134/103.2; 134/144; 134/148; 134/149; 134/151; 134/153; 134/154; 134/157; 134/184; 134/198; 134/902
(58) Field of Classification Search ............ 134/137, 134/138, 140, 144, 147, 148, 149, 151, 153, 134/154, 94.1, 95.1, 99.1, 103.2, 103.3, 184, 134/198, 199, 95.3, 902
See application file for complete search history.

(56) References Cited

U.S. PATENT DOCUMENTS

| | | | | |
|---|---|---|---|---|
| 5,375,291 A | * | 12/1994 | Tateyama et al. | 15/302 |
| 5,729,856 A | | 3/1998 | Jang et al. | 15/88.1 |
| 5,879,576 A | * | 3/1999 | Wada et al. | 216/91 |
| 6,039,059 A | * | 3/2000 | Bran | 134/105 |
| 6,114,254 A | | 9/2000 | Rolfson | 438/758 |
| 6,202,658 B1 | * | 3/2001 | Fishkin et al. | 134/147 |
| 6,491,764 B2 | * | 12/2002 | Mertens et al. | 134/36 |

(Continued)

FOREIGN PATENT DOCUMENTS

JP 61-16528 * 1/1986

(Continued)

OTHER PUBLICATIONS

Office Action, Korean Application No.: 10-2001-0074311, Jan. 26, 2004, 2 pages.

*Primary Examiner*—M. Kornakov
(74) *Attorney, Agent, or Firm*—Myers Bigel Sibley and Sajovec, P.A.

(57) ABSTRACT

A cleaning apparatus includes upper and lower nozzle assemblies supplying a cleaning liquid to edge and bottom sections of a semiconductor substrate. The upper nozzle assembly has a first nozzle supplying the cleaning liquid onto the edge section, and second and third nozzles supplying a nitrogen gas for preventing the cleaning liquid from moving into a center portion of the semiconductor substrate. The cleaning liquid supplied to the edge section flows from the edge section towards a side section of the semiconductor substrate due to the rotation of the semiconductor substrate. An ultrasonic wave generator is provided above the edge section for generating ultrasonic waves. The ultrasonic waves are applied to the cleaning liquid supplied onto the edge and bottom sections, thereby improving the cleaning efficiency. The cleaning apparatus has a guide to guide the cleaning liquid supplied to the edge section toward the side section. The cleaning apparatus may effectively remove impurities from the edge, side and bottom sections of the semiconductor substrate.

15 Claims, 7 Drawing Sheets

U.S. PATENT DOCUMENTS

| | | |
|---|---|---|
| 6,543,080 B1 | 4/2003 | Tomita et al. |
| 2002/0035762 A1 * | 3/2002 | Okuda et al. ............. 15/77 |
| 2003/0000034 A1 * | 1/2003 | Welsh et al. ............. 15/77 |
| 2003/0178049 A1 * | 9/2003 | Yoon et al. ............. 134/147 |
| 2003/0192570 A1 * | 10/2003 | Thakur et al. ............. 134/1.3 |

FOREIGN PATENT DOCUMENTS

| | | |
|---|---|---|
| JP | 11260778 A2 | 9/1999 |
| JP | 13-53047 | 4/2003 |
| KR | 1998-56129 | 9/1998 |

* cited by examiner

CLEANING METHOD AND CLEANING APPARATUS FOR PERFORMING THE SAME

RELATED APPLICATIONS

The present application claims priority from Korean Patent Application No. 2001-74311, filed Nov. 27, 2001, the disclosure of which is hereby incorporated herein by reference in its entirety.

FIELD OF THE INVENTION

The present invention relates to methods and apparatus for cleaning semiconductor substrates and, more particularly, to a method and an apparatus for cleaning an edge section, a side section, and a bottom section of a semiconductor substrate.

BACKGROUND OF THE INVENTION

Generally, semiconductor devices are manufactured by sequentially performing unit processes, such as deposition, photolithography, etching, ion implantation, polishing, cleaning and drying processes, on a semiconductor substrate. Among the above unit processes, the cleaning process is carried out after each unit process has been finished so as to remove the residue remaining on the semiconductor substrate. Recently, as designs tend to require a micro-sized pattern, the cleaning process has become very important.

However, impurities that remain at an edge section, a side section and a bottom section of the semiconductor substrate while the unit processes are being carried out typically are not completely removed through a general cleaning process. In order to clean the edge, side and bottom sections of the semiconductor substrate on which a metal wiring is formed, photoresist composition is coated on the semiconductor substrate, and exposure and development processes are carried out on the semiconductor substrate except for the metal wiring section. Thereafter, the semiconductor substrate is cleaned through various methods.

In a single-wafer type cleaning method, cleaning liquid is supplied to the edge section of the semiconductor substrate while rotating a vacuum chuck that grips the semiconductor substrate, thereby removing the impurities sticking to the edge section of the semiconductor substrate. In a batch type cleaning method, multiple lots of semiconductor substrates are simultaneously cleaned in a bath having the cleaning liquid therein.

However, the single-wafer type cleaning method may not effectively remove the impurities sticking to the side and bottom sections of the semiconductor substrate. In the batch type cleaning method, because the impurities separated from the semiconductor substrate float on the cleaning liquid or reside in the cleaning liquid, the impurities may reattach to the semiconductor substrate. Furthermore, the batch type cleaning method may not effectively clean the edge and side sections of the semiconductor substrate.

The impurities sticking to the surface of the semiconductor substrate may cause a process failure when performing a following process, thereby lowering the yield and productivity of the semiconductor device. In addition, because the photolithography process is required for protecting the metal wiring during the cleaning process, the manufacturing cost of the semiconductor device is increased.

Various attempts have been made to solve the foregoing problems. For example, Japanese Patent Publication No. 11-260778 (issued to Kuniyasu) discloses a single-wafer type cleaning device. Cleaning liquid is supplied to a surface of a wafer from a cleaning liquid nozzle. An ultrasonic wave is simultaneously provided by means of an ultrasonic vibration plate, thereby effectively removing the impurities from the wafer with improved cleaning of a bottom of the wafer. However, Kuniyasu's cleaning device does not selectively clean a specific portion of the wafer. U.S. Pat. No. 5,729,856 to Jang et al. discloses a cleaning device for cleaning an edge section of a wafer. U.S. Pat. No. 6,114,254 to Rolfson discloses a cleaning device in which cleaning liquid is supplied to edge and bottom sections of a wafer. However, the cleaning devices of the U.S. patents may cause a center portion of the wafer formed with a metal wiring to be exposed to the cleaning liquid.

SUMMARY OF THE INVENTION

Embodiments of the present invention provide cleaning apparatus and methods that can effectively remove impurities from edge, side and bottom sections of a semiconductor substrate while preventing cleaning liquid from penetrating into a center portion of the semiconductor substrate.

According to method embodiments of the present invention, a method for cleaning a semiconductor substrate includes rotating the semiconductor substrate. A cleaning liquid is supplied to an edge section of the semiconductor substrate for cleaning the edge section and a side section of the semiconductor substrate. An ultrasonic wave is applied to the cleaning liquid supplied to the edge section.

According to further embodiments of the present invention, an apparatus for cleaning a semiconductor substrate having an edge section and a side section includes a chuck on which the semiconductor substrate can be mounted for rotating the semiconductor substrate. When the semiconductor substrate is mounted on the chuck, an upper nozzle assembly is positioned above the edge section of the semiconductor substrate to supply a cleaning liquid to the edge section of the semiconductor substrate for cleaning the edge section and the side section of the semiconductor substrate. When the semiconductor substrate is mounted on the chuck, an ultrasonic wave generator is positioned above the edge section to apply ultrasonic waves to the cleaning liquid supplied to the edge section.

The cleaning liquid supplied from the upper nozzle may flow from the edge section to the side section of the semiconductor substrate, and the ultrasonic waves may be applied to the cleaning liquid supplied to the edge section. In this manner, the cleaning effect with respect to the edge and side sections of the semiconductor substrate can be improved.

In addition, first and second nitrogen gas streams may be supplied from further respective nozzles to prevent the cleaning liquid from moving into the center portion of the semiconductor substrate. Accordingly, a pattern and a metal wiring formed on the semiconductor substrate can be protected from the cleaning liquid.

In addition, a further nozzle may be provided to supply a second cleaning liquid to a bottom section of the semiconductor substrate. The ultrasonic waves generated from the ultrasonic wave generator may be applied to the second cleaning liquid supplied to the bottom section by passing through the semiconductor substrate to improve the cleaning effect with respect to the bottom section.

Objects of the present invention will be appreciated by those of ordinary skill in the art from a reading of the figures

DESCRIPTION OF THE PREFERRED EMBODIMENTS

Figure 1:
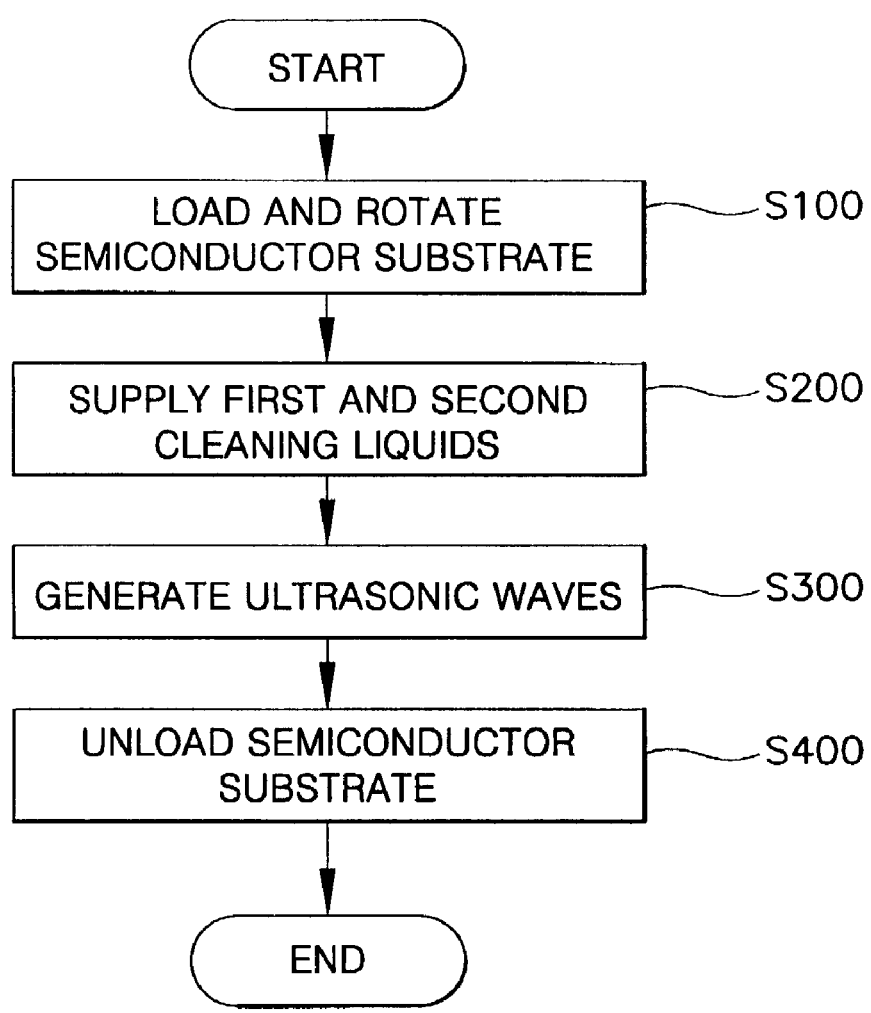
FIG. 1 is a flow chart representing methods for cleaning a semiconductor substrate according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
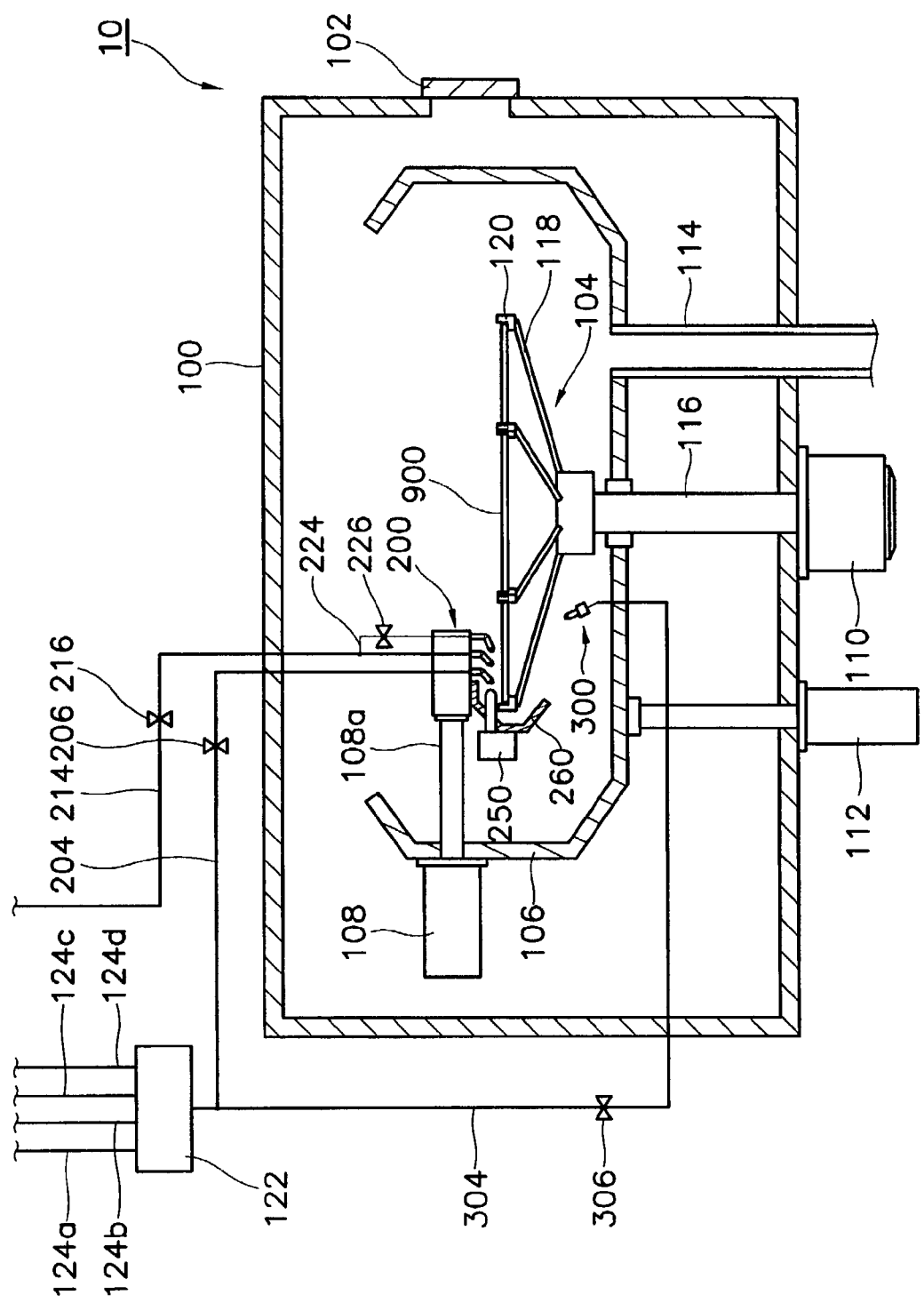
FIG. 2 is a schematic, sectional view of a cleaning apparatus for performing methods as illustrated by the flow chart of FIG. 1 according to embodiments of the present invention.

With reference to FIG. 1, the flow chart thereof illustrates methods in accordance with the present invention for cleaning a semiconductor substrate. With reference to FIG. 2, a cleaning apparatus 10 according to embodiments of the present invention is shown therein. Various components and subsections of the cleaning apparatus 10 are further illustrated in FIGS. 3–7, including a control system 121 as shown in FIG. 6.

Referring to FIG. 1, according to method embodiments of the invention, a semiconductor substrate 900 is loaded in a rotating chuck by means of a conveying device, such as a robot, and the rotating chuck is rotated at a proper speed (Step S100). Then, a first cleaning liquid is supplied to an edge section 900a (see FIG. 4) of the semiconductor substrate 900 being rotated. Simultaneously, first and second nitrogen gas streams are provided to restrict, and preferably prevent, the first cleaning liquid from moving toward a center portion 900c (see FIG. 4) of the semiconductor substrate. At the same time, a second cleaning liquid is supplied to a bottom section 900d (see FIG. 4) of the semiconductor substrate (Step S200).

Thereafter, ultrasonic radiation or waves are applied to the first cleaning liquid supplied onto the edge section 900a of the semiconductor substrate. The ultrasonic waves are also applied to the second cleaning liquid by passing through the semiconductor substrate (Step S300). The first cleaning liquid flows from the edge section 900a to the side section 900b of the semiconductor substrate. The second cleaning liquid flows along the bottom section 900d of the semiconductor substrate. The ultrasonic waves can improve the cleaning efficiency of the first and second cleaning liquids. The cleaning time and composition of the cleaning liquid can be varied depending on the impurities to be removed. When the cleaning process has been finished, the rotation of the chuck is stopped and the semiconductor substrate is unloaded from the chuck (Step S400).

The first cleaning liquid is supplied, preferably as a liquid stream, from the center portion 900c of the semiconductor substrate towards the edge section 900a of the semiconductor substrate, preferably at an incident angle of 30 to 60 degrees, such that the first cleaning liquid is prevented from moving or being displaced to the center portion 900c. In addition, the first and second nitrogen gas streams are respectively supplied to first and second sections of the semiconductor substrate, which are spaced apart from the edge section 900a in the direction of the center portion 900c. The first nitrogen gas stream is preferably supplied at an incident angle of 30 to 60 degrees in the same direction as the supplying direction of the first cleaning liquid. In addition, the second nitrogen gas stream is preferably supplied at an incident angle of 15 to 30 degrees in the same direction as the supplying direction of the first cleaning liquid. At this time, the edge section 900a is spaced apart from the side section 900b of the semiconductor substrate by about 5 mm or less, and the first section 900e (see FIG. 5) is spaced apart from a first cleaning liquid receiving portion, to which the first cleaning liquid is supplied, by about 3 to 15 mm. The first section 900e may be the same as the second section. However, the present invention is not limited to the described ranges of the edge section 900a and the first and second sections. Rather, such ranges can be varied depending on sections of the semiconductor substrate to be cleaned.

Preferably, the rotating speed of the semiconductor substrate is between about 18 and 20 rpm, and the flow rate of the first and second cleaning liquid is between about 1 and 5 liters/minute. In this case, the first and second cleaning liquids supplied to the edge section and bottom section of the semiconductor substrate can stably flow along the side and bottom sections of the semiconductor substrate, respectively, without moving or being displaced therefrom. However, in accordance with the present invention, the rotating speed of the semiconductor substrate and the flow rate of the cleaning liquid may be varied depending on the conditions of the cleaning process.

Examples of the first and second cleaning liquids include deionized water, a mixture of HF and deionized water, a mixture of $NH_4OH$, $H_2O_2$ and deionized water, a mixture of $NH_4F$, HF, and deionized water, a mixture of $H_3PO_4$ and deionized water, etc.

Generally, deionized water may be used for removing impurities from the semiconductor substrate and for rinsing the semiconductor substrate.

The mixture (DHF) of HF and deionized water may be used for removing native oxide ($SiO_2$) layer and metal ions formed on the semiconductor substrate. The mixing ratio of HF to deionized water is preferably between about 1:1000 and 1:500. However, the mixing ratio can be varied depending on the cleaning conditions.

Generally, the mixture of $NH_4OH$, $H_2O_2$ and deionized water, referred to as SC1 (standard cleaning 1) solution, may be used to remove an oxide layer formed on the semiconductor substrate and organic matter attached to the semiconductor substrate. The mixing ratio of $NH_4OH$, $H_2O_2$ and deionized water is preferably about 1:4:20 and about 1:4:100. The mixing ratio can be varied depending on the conditions of the cleaning process.

In addition, the mixture of $NH_4F$, HF, and deionized water, referred to as LAL solution, may be used to remove an oxide layer formed on the semiconductor substrate, and the mixture of $H_3PO_4$ and deionized water may be used to remove nitride based impurities.

The cleaning efficiency is improved as the temperature of the first and second cleaning liquids increases, and the temperature can be properly adjusted. In addition, the various cleaning liquids can be sequentially used depending on the kinds of impurities to be removed.

Further aspects of methods according to the invention are discussed below with reference to the cleaning apparatus 10.

Referring to FIG. 2, the cleaning apparatus 10 includes a chamber 100 defining a space for performing the cleaning process. A door 102 is provided at one side of the chamber 100 so as to allow the semiconductor substrate 900 to be introduced into and withdrawn from the chamber 100. A chuck 104 is provided in the chamber 100. The chuck 104 grips and rotates the semiconductor substrate 900. A cover 106 is provided at a peripheral portion of the chuck 104 in order to prevent the cleaning liquid separated from the semiconductor substrate 900 from dispersing in the chamber 100 while the cleaning process is being carried out. A first pneumatic cylinder 108 is installed at a side of the cover 106 to drive an upper nozzle assembly 200 for cleaning the edge and side sections of the semiconductor substrate 900. Installed below the chamber 100 are a motor for rotating the chuck 104 and a second pneumatic cylinder 112 for driving the cover 106 up and down. In addition, a lower nozzle assembly 300 is positioned below the semiconductor substrate 900 so as to clean a bottom section of the semiconductor substrate 900.

The cover 106 has a cup shape and surrounds the chuck 104. The first pneumatic cylinder 108 is installed at an outer wall of the cover 106. A rod 108a of the first pneumatic cylinder 108 extends towards the chuck 104 by passing through the cover 106. An ultrasonic wave generator 250 is connected to an end of the rod 108a of the first pneumatic cylinder 108. The rod 108a of the first pneumatic cylinder 108 is driven in a radial direction relative to the semiconductor substrate 900 so as to adjust the position of the upper nozzle assembly 200 and ultrasonic wave generator 250. The upper nozzle assembly 200 includes a plurality of nozzles and a guide 260 through which the ultrasonic wave generator 250 is installed. That is, the first pneumatic cylinder 108 simultaneously drives the upper nozzle assembly 200 and the ultrasonic wave generator 250, which is described in more detail below with reference to FIG. 4. A drain tube 114 for draining the used cleaning liquid is connected to a lower side of the cover 106. A rotating shaft 116 connected to the motor 110 for rotating the semiconductor substrate 900 is installed below the cover 106 by passing through the center of the bottom of the cover 106.

Figure 3:
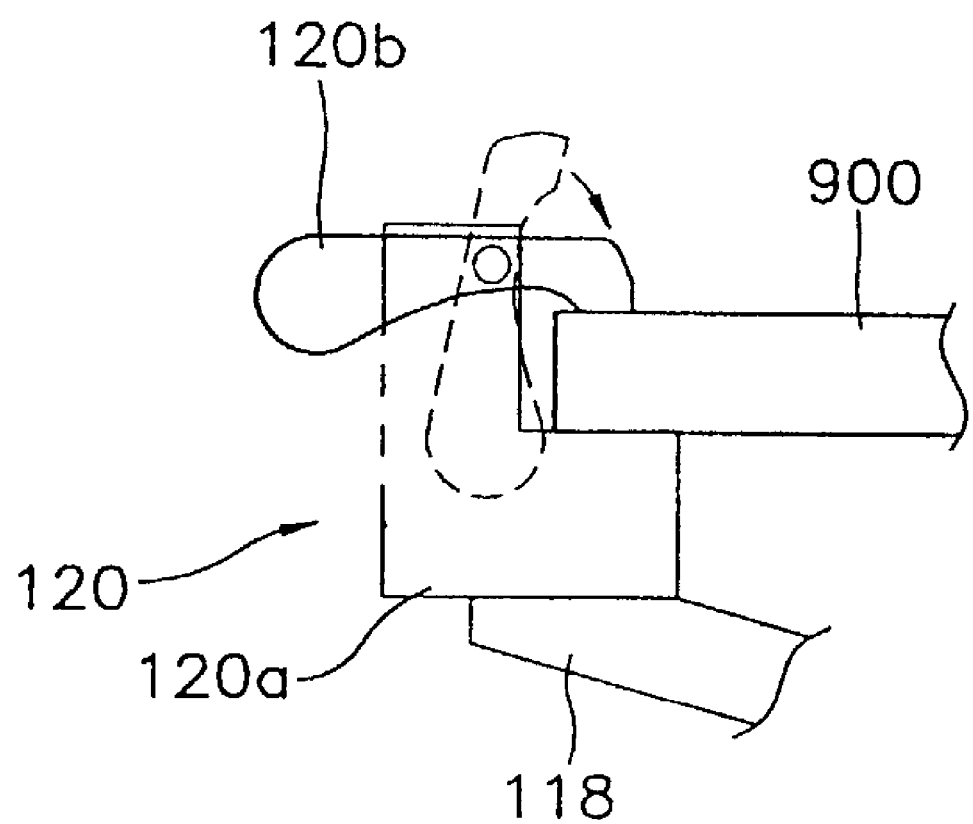
FIG. 3 is a detailed view of a clamp of the apparatus of FIG. 2.

A plurality of radially extending rods 118 is provided at an upper portion of the rotating shaft 116. The rods 118 transfer the driving force of the motor 110 while supporting the semiconductor substrate 900. Each of the rods 118 has a clamp 120 connected thereto for fixing the semiconductor substrate 900. Referring to FIG. 3, each clamp 120 includes a clamp housing 120a connected to the respective rod 118 and a clamp body 120b rotatably installed in the clamp housing 120a. When the chuck 104 is at rest for loading and unloading the semiconductor substrate 900, the clamp body 120b rotates counterclockwise, to the position shown in dashed lines in FIG. 3, due to the static weight balance thereof, thereby allowing the semiconductor substrate 900 to be easily loaded or unloaded. On the other hand, when the loaded chuck 104 and the semiconductor substrate 900 are rotated, the clamp body 120 rotates clockwise, to the position shown in solid lines in FIG. 3, due to a centrifugal force, thereby gripping the semiconductor substrate 900.

Figure 4:
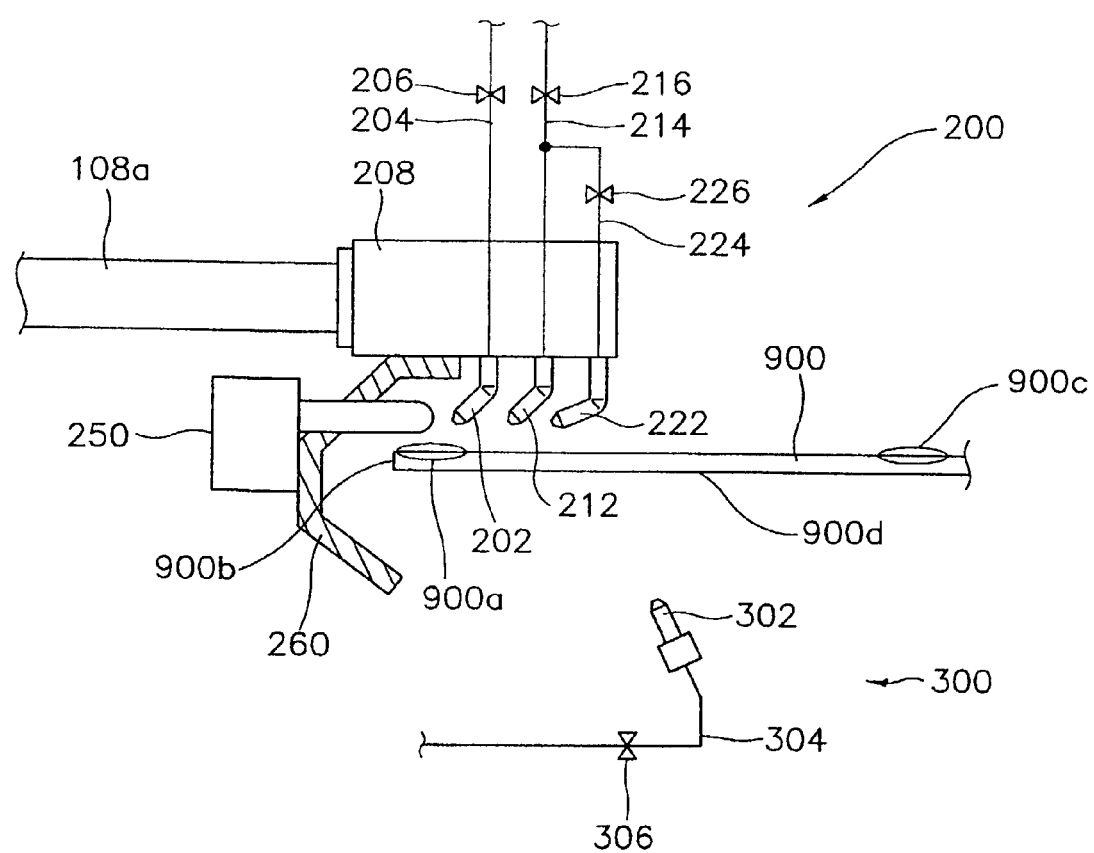
FIG. 4 is a detailed view of upper and lower nozzle assemblies of the apparatus of FIG. 2.

Referring to FIG. 4, a bracket 208 for fixing the upper nozzle assembly 200 is connected to the rod 108a of the first pneumatic cylinder 108 installed at a side of the cover (see FIG. 2). A first nozzle 202 is connected to a lower portion of the bracket 208 so as to supply the first cleaning liquid, preferably as a liquid stream, to the edge section 900a of the semiconductor substrate 900. A second nozzle 212 is arranged alongside the first nozzle 202 so as to provide a first nitrogen gas stream for primarily restricting, and preferably preventing, the first cleaning liquid from moving into the center portion 900c of the semiconductor substrate 900. In addition, a third nozzle 222 is arranged alongside the second nozzle 212 so as to provide a second nitrogen gas stream for secondarily restricting, and preferably preventing, the first cleaning liquid from moving into the center portion 900c of the semiconductor substrate 900. That is, the first to third nozzles 202, 212 and 222 are sequentially positioned from the edge section 900a towards the center portion 900c.

A first line 204 for guiding the first cleaning liquid is connected to one end of the first nozzle 202. A first valve 206 is installed in the first line 204 to control the flow rate of the first cleaning liquid. A second line 214 for guiding the first nitrogen gas is connected to one end of the second nozzle 212. A second valve 216 is installed in the second line 214 to control the flow rate of the first nitrogen gas. In addition, a third line 224 branched from the second line 214 is connected to one end of the third nozzle 222 for guiding the second nitrogen gas. A third valve 226 is installed in the third line 224 so as to control the flow rate of the second nitrogen gas.

In addition, the guide 260 is connected to a lower portion of the bracket 208 to inhibit or prevent the first cleaning liquid, which is supplied to the edge section 900a of the semiconductor substrate 900 from the first nozzle 202, from being separated from the edge section 900a of the semiconductor substrate 900 because of the rotation of the semiconductor substrate 900. When the semiconductor substrate 900 rotates at a relatively low speed, the first cleaning liquid flows from the edge section 900a of the semiconductor substrate 900 to the side section 900b of the semiconductor substrate 900. However, when the semiconductor substrate 900 rotates at a relatively high speed, the first cleaning liquid is separated from the semiconductor substrate 900 without flowing along the side section 900b of the semiconductor substrate 900. The first cleaning liquid separated from the semiconductor substrate 900 cannot wash the side section 900b of the semiconductor substrate 900. For this reason, the guide 260 is provided to direct the first cleaning liquid separated from the semiconductor substrate 900 towards the edge section 900a or the side section 900b of the semiconductor substrate 900. Accordingly, the edge section 900a or the side section 900b of the semiconductor substrate 900 can be washed by the first cleaning liquid redirected towards the edge section 900a or the side section 900b by the guide 260.

The ultrasonic wave generator 250 for applying ultrasonic waves to the first cleaning liquid supplied to the edge section 900a of the semiconductor substrate 900 has a rod shape and extends towards an upper portion of the edge section 900a of the semiconductor substrate 900 by passing through the guide 260.

The lower nozzle assembly 300 is provided below the semiconductor substrate 900 in order to wash the bottom section 900d of the semiconductor substrate 900. The lower nozzle assembly 300 includes a fourth nozzle supplying a second cleaning liquid, preferably as a liquid stream, to the bottom section 900d of the semiconductor substrate 900, a fourth line 304 connected to one end of the fourth nozzle 302 to guide the second cleaning liquid into the fourth nozzle 302, and a fourth valve 306 installed in the fourth line 304 so as to control the flow rate of the second cleaning liquid. The position of the lower nozzle assembly 300 can be variously adjusted such that the bottom section 900d of the semiconductor substrate 900 can be selectively washed.

The first pneumatic cylinder 108 can adjust the position of the upper nozzle assembly 200, preferably in about 0.1 $\mu$m increments. Preferably, the distance between the guide of the upper nozzle assembly 200 and the semiconductor substrate 900 is at least about 1 cm. Preferably, the edge section 900a of the semiconductor substrate 900 except for the center portion 900c of the semiconductor substrate 900 formed with a pattern and a metal wiring is no greater than about 5 mm from the side section 900b of the semiconductor substrate 900. In addition, the location on the semiconductor substrate 900 to which the first cleaning liquid is supplied is adjusted by the first pneumatic cylinder 108. However, the present invention is not limited to the above ranges. The range of the edge section 900a can be varied depending on the size of the semiconductor substrate 900 and distribution of impurities to be removed.

The flow rate of the first and second cleaning liquids supplied through the first and fourth nozzles 202 and 302 is about 1 to 5 liters/minute, respectively. In addition, the first cleaning liquid supplied to the edge section 900a of the semiconductor substrate 900 flows along the side section 900b of the semiconductor substrate 900 by passing through between the semiconductor substrate 900 and the ultrasonic wave generator 250. The ultrasonic waves generated from the ultrasonic wave generator 250 improve the cleaning efficiency of the cleaning liquid. The ultrasonic waves are also applied to the second cleaning liquid supplied to the bottom section 900d of the semiconductor substrate 900 by passing through the semiconductor substrate 900. Accordingly, the cleaning effect with respect to the bottom section 900d of the semiconductor substrate 900 is improved. The flow rate of the first and second cleaning liquids can be varied. It is preferred to adjust the flow rate of the first and second cleaning liquids such that the first and second cleaning liquids simultaneously make contact with the semiconductor substrate 900 and the ultrasonic wave generator 250. At this time, the spacing between the semiconductor substrate 900 and the ultrasonic wave generator 250 is preferably between about 1 and 3 mm.

The guide 260 is preferably made of Teflon™ (PTFE) resin, which is resistant against the cleaning liquid and has a long lifetime and corrosion resistance. In addition, the first and fourth lines 204 and 304 for providing the first and second cleaning liquids are preferably made of a Teflon™ tube having a diameter of about 1/16 to 1/8 inch. The third line 224 used for providing the second nitrogen gas is preferably made of a Teflon™ tube having a diameter of about 1/16 inch.

Figure 5:
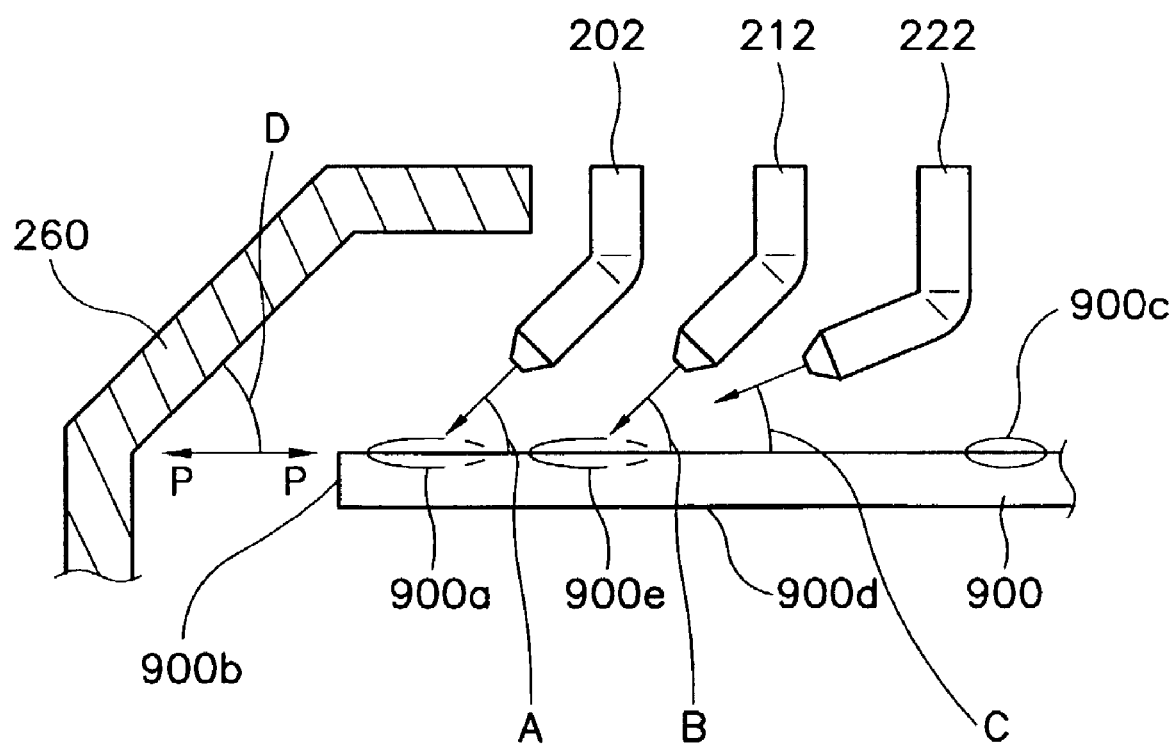
FIG. 5 is a detailed view of the upper nozzle assembly of FIG. 4.
Figure 6:
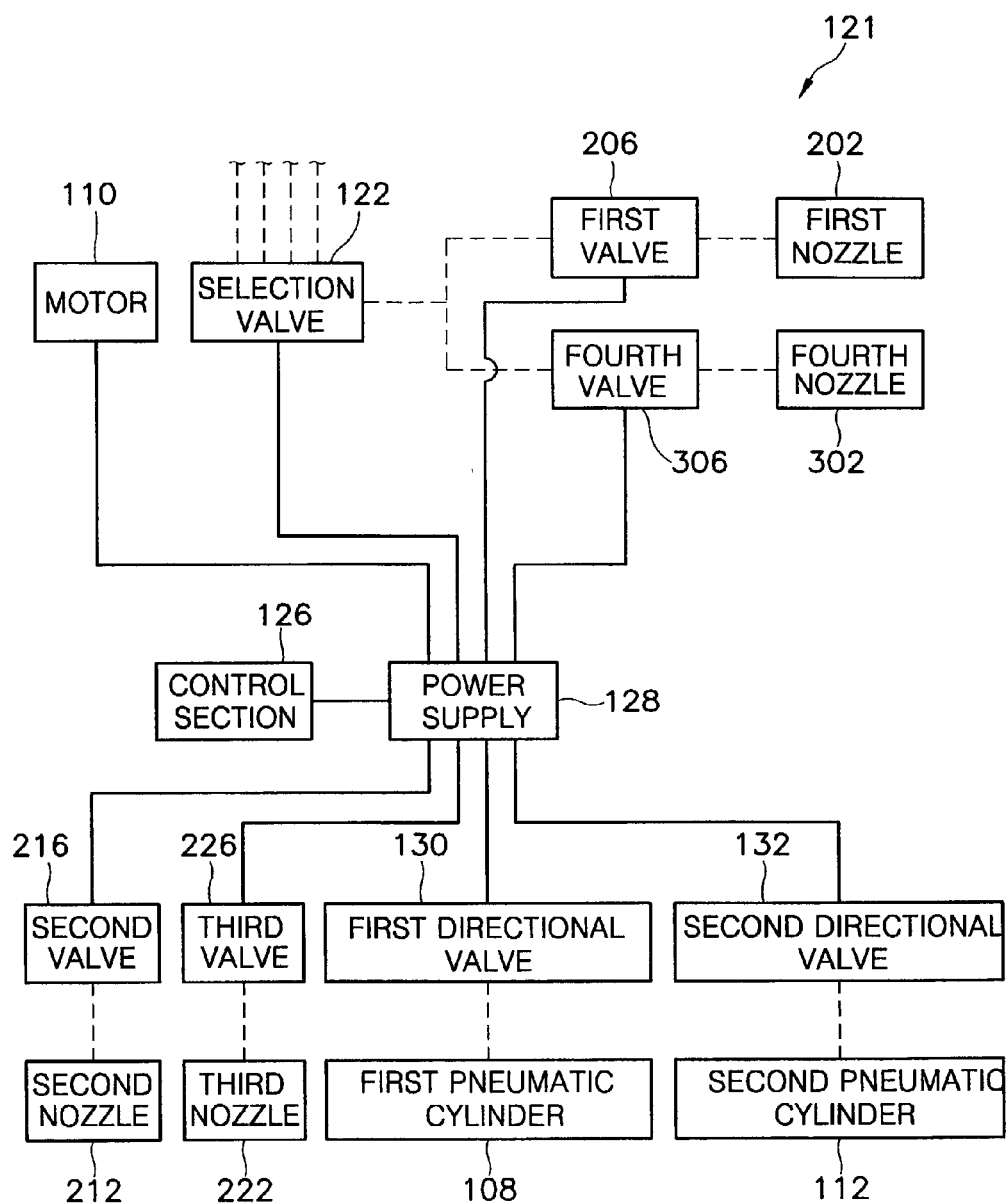
FIG. 6 is a block diagram showing a control system for controlling operations of the cleaning apparatus of FIG. 2.

Referring to FIG. 5, the spacing between the first and second nozzles 202 and 212 is preferably between about 3 and 15 mm. The above spacing can be varied depending on the flow rate of the first cleaning liquid, the rotational speed of the semiconductor substrate 900, and the type of the first cleaning liquid. The spacing between the edge section 900a to which the first cleaning liquid is supplied and a first section 900e to which the first nitrogen gas is supplied is dependent on the spacing between the first and second nozzles 202 and 212.

The first nozzle 202 is inclined from the center portion 900c to the edge section 900a of the semiconductor substrate 900 so as to prevent the first cleaning liquid from moving into the center portion 900c of the semiconductor substrate 900. The first nozzle 202 preferably has an incline angle A of between about 30 and 60 degrees with respect to the semiconductor substrate 900 (ie., relative to the plane P—P defined by the substantially planar upper surface of the semiconductor substrate 900). An incline angle B of the second nozzle 212 is preferably identical to the incline angle A of the first nozzle and an incline angle C of the third nozzle 222 is preferably from about 15 to 30 degrees with respect to the semiconductor substrate plane P—P.

The guide 260, which directs the first cleaning liquid separated from the semiconductor substrate 900 towards the edge section 900a or the side section 900b when the semiconductor substrate 900 rotates at a high speed, preferably has an incline angle from about 40 to 50 degrees with respect to the semiconductor substrate plane P—P.

Referring again to FIG. 2, the first line 204 supplying the first cleaning liquid and the fourth line 304 supplying the second cleaning liquid are connected to a selection valve 122 to which various cleaning liquid supplying lines are connected. The cleaning liquid supplying lines include a deionized water supplying line 124a, an HF solution supplying line 124b in which HF is diluted with deionized water, an SC1 solution supplying line 124c and an LAL solution supplying line 124d. Additionally, various kinds of cleaning liquids can be supplied depending on the sorts of impurities to be removed. Though the first and second cleaning liquids are supplied from the same line in the described embodiment, the first and second cleaning liquids can be supplied from different lines, respectively, depending on the sorts of impurities to be removed.

The cleaning process of the semiconductor substrate 900 is preferably carried out in the following order. Firstly, the door 102 is opened and the semiconductor substrate 900 is loaded on the chuck 104. At this time, the first and second pneumatic cylinders 108 and 112 are in a compression state. Because the first pneumatic cylinder 108 is compressed, the upper nozzle assembly 200 and the ultrasonic wave generator 250 are positioned adjacent to the chuck 104. In addition, because the second pneumatic cylinder 112 is compressed, the cover 106, the first pneumatic cylinder 108, the upper nozzle assembly 200 and the ultrasonic wave generator 250 are moved to predetermined positions to allow the semiconductor substrate 900 to move into the chuck 104.

Then, a robot (not shown) conveying the semiconductor substrate 900 moves out of the chamber 100 and the door 102 is closed. A lift pin may be used to load the semiconductor substrate 900 into the chuck 104 from the robot.

Thereafter, the second pneumatic cylinder 112 is expanded so that the cover 106, the first pneumatic cylinder 108, the upper nozzle assembly 200 and the ultrasonic wave generator 250 are upwardly moved to the cleaning position. Then, the first pneumatic cylinder 108 is expanded so that the upper nozzle assembly 200 and the ultrasonic wave generator 250 are moved toward the edge section 900a of the semiconductor substrate 900.

Then, the motor 110 rotates at a predetermined speed, and the first and second cleaning liquids are supplied to the semiconductor substrate 900 through the first and fourth nozzles 202 and 302. In addition, the first and second nitrogen gases are supplied through the second and third nozzles 212 and 222. While the first and second cleaning liquids are being supplied, the ultrasonic waves generated from the ultrasonic wave generator 250 are applied to the first and second cleaning liquids. Then, the first cleaning liquid flows from the edge section 900a of the semiconductor substrate 900 to the side section 900b of the semiconductor substrate 900, and the second cleaning liquid flows along the bottom section 900d of the semiconductor substrate 900 due to the centrifugal force caused by the rotation of the semiconductor substrate 900.

When impurities have been removed from the edge section 900a, side section 900b, and bottom section 900d of the semiconductor substrate 900, the motor 110 is stopped and the first and second pneumatic cylinders 108 and 113 are sequentially operated, so that the cover 106, the first pneumatic cylinder 108, the upper nozzle assembly 200 and the ultrasonic wave generator 250 are moved to their initial positions. Then, the semiconductor substrate 900 is lifted (e.g., by a lift pin) and conveyed to a following process by means of the robot.

Referring to FIG. 6, the cleaning apparatus shown in FIG. 2 further includes a control system 121 as shown therein. The control system 121 includes a control section 126 for controlling the cleaning process. The control section 126 is connected to a power supply 128, which provides power as required for operating the cleaning apparatus. The control section 126 controls the rotational force of the motor 110 for rotating the semiconductor substrate 900. The power supply 128 supplies the power to the motor 110 based on a control signal from the control section 126.

The control section 126 controls the operation of the selection valve 122. That is, when the type of the cleaning liquid has been selected based on the impurities to be removed, the control section 126 controls the operation of the selection valve 122 to supply the selected cleaning liquid to the semiconductor substrate. The control section 126 can select only one cleaning liquid or can sequentially select various kinds of cleaning liquids depending on the sorts of impurities to be removed. In addition, the power supply 128 supplies the power to the selection valve 122 for driving the selection valve 122 based on the control signal of the control section 126. The selection valve 122 may be an electromagnetic solenoid valve.

The first and second cleaning liquids passing through the selection valve 122 are supplied to the edge section 900a and the bottom section 900d of the semiconductor substrate 900 through the first and fourth nozzles 202 and 302. At this time, the first and fourth valves 206 and 306 control the flow rates of the first and second cleaning liquids. The control section 126 generates a control signal to control the operations of the first and fourth valves 206 and 306. The power supply 128 supplies the power to the first and fourth valves 306 based on the control signal from the control section 126. The first and fourth valves 206 and 306 may be electromagnetic solenoid valves.

The control section 126 controls the flow rate of the first and second nitrogen gases which are supplied to the semiconductor substrate 900 through the second nozzle 212 connected to the second valve 216 and the third nozzle 222 connected to the third valve 226. In the same manner as in the first and fourth valves 216 and 226, the second and third valves 216 and 226 may be electromagnetic solenoid valves.

The control section 126 generates a control signal for controlling the operation of the first and second pneumatic cylinders 108 and 112. The power supply 128 supplies the power to first and second directional valves 132, which adjust the direction and flow rate of pressurized air supplied to the first and second pneumatic cylinders 108 and 112, based on the control signal applied from the control section 126. The first and second directional valves 130 and 132 adjust the direction and flow rate of the pressurized air by means of electromagnetic solenoids.

The structure of the control system according to the present invention can be varied depending on the conditions of the cleaning apparatus. That is, the kinds of valves used for controlling the flow rate of the first and second cleaning liquids, first and second nitrogen gases, and the pressurized air can be varied. In addition, a pressure control valve and a safety valve can be added to the control system. It is also possible to use a hydraulic cylinder instead of first and second pneumatic cylinders operated by the pressurized air. In addition, the first and second pneumatic cylinders can be replaced with, for example, a motor and lead screw.

Figure 7:
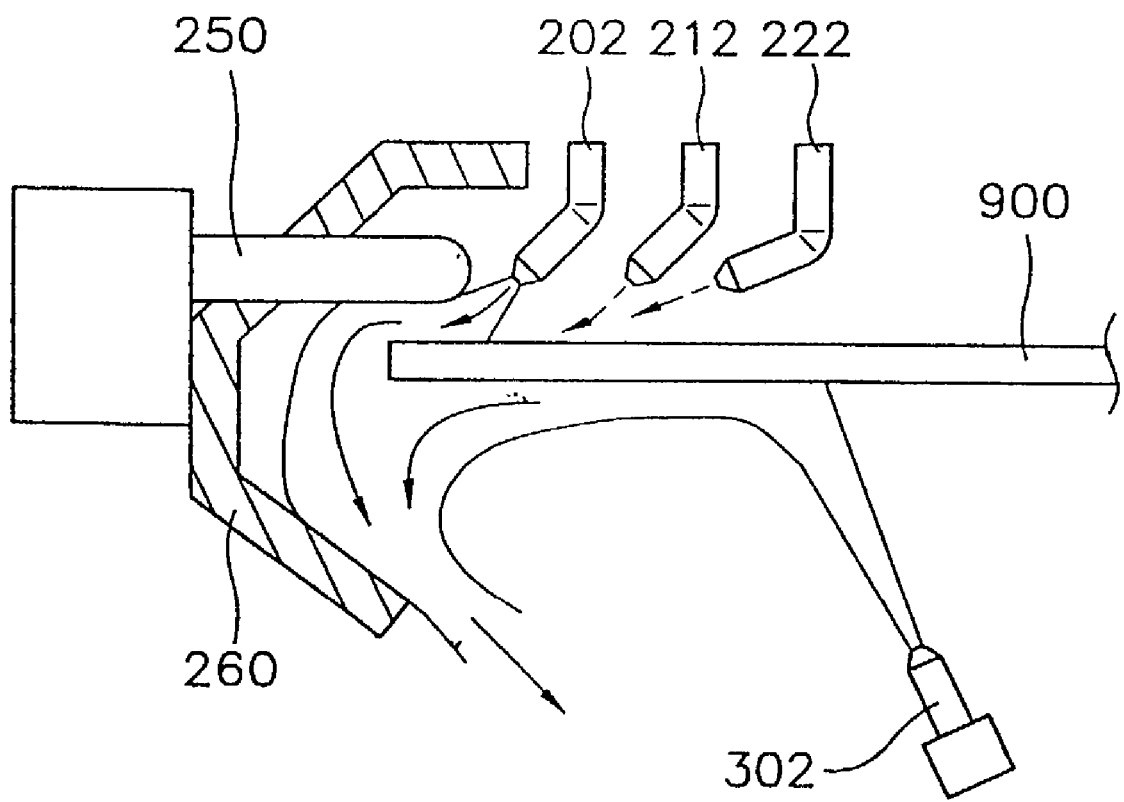
FIG. 7 is a fragmentary view showing flow directions of first and second cleaning liquids of the apparatus of FIG. 1.

The flow direction of the first and second cleaning liquids is illustrated in FIG. 7. Referring to FIG. 7, the first cleaning liquid supplied to the edge section 900a of the semiconductor substrate 900 through the first valve 202 is prevented from moving into the center portion 900c by the first and second nitrogen gas streams supplied from the second and third nozzles 212 and 222. In addition, the first cleaning liquid moves towards the side section 900b while making contact with the ultrasonic wave generator 250 and the edge section 900a. Then, the first cleaning liquid moves down along the side section 900b. The second cleaning liquid supplied to the bottom section 900d of the semiconductor substrate 900 through the fourth valve 302 moves to the side section 900b while making contact with the bottom section 900d. Then, the second cleaning liquid moves down together with the first cleaning liquid. At this time, the guide 260 guides the first and second cleaning liquids.

The frequency of the ultrasonic wave generated from the ultrasonic wave generator 250 is varied depending on the kinds of impurities to be removed. Generally, an ultrasonic wave having a frequency above 800 kHz is used. The ultrasonic waves are applied to the first cleaning liquid and are also applied to the second cleaning liquid by passing through the semiconductor substrate 900.

EXAMPLE

Table 1 shows test results of cleaning efficiency with respect to the semiconductor substrate. The tests were carried out with applying the ultrasonic waves to SC1 solution and without applying the ultrasonic waves to general SC1 solution.

TABLE 1

| | Power used | 30 sec | 60 sec | |
|---|---|---|---|---|
| SC1 (without ultrasonic wave) | 0 | 31.0% | 35.0% | |
| SC1 (both surfaces of substrate) + ultrasonic wave (upper surface of substrate | 50 | 99.7% | 99.3% | |
| | 75 | 81.4% | 92.5% | |
| | 100 | 84.8% | 93.1% | |
| | 125 | 85.4% | 95.8% | |
| Deionized water (upper surface of substrate) + | 50 | 98.7% | — | Front loading |
| SC1 (lower surface of substrate) + ultrasonic wave (upper surface of substrate | 50 | 99.7% | — | Bottom loading |

In the above test, the semiconductor substrate was intentionally contaminated with silicon nitride (SiN) gel, and the silicon nitride gel was removed by using SC1 solution having a temperature of about 65° C. The frequency of the ultrasonic wave was 830 kHz.

In the first test, the semiconductor substrate was loaded such that a surface formed with the silicon nitride gel was upwardly directed. When only the SC1 solution was used, 30% of the silicon nitride gel was removed. On the other hand, when the ultrasonic waves were applied to the SC1 solution, 81 to 99% of silicon nitride gel was removed.

In the second test, deionized water was supplied onto an upper surface of the semiconductor substrate and the SC1 solution was supplied to the lower surface of the semiconductor substrate. In addition, the ultrasonic waves were applied to the upper surface of the semiconductor substrate. When the semiconductor substrate was loaded such that a surface formed with the silicon nitride gel was upwardly directed, 98.7% of silicon nitride gel was removed. In addition, when the semiconductor substrate was loaded such that a surface formed with the silicon nitride gel was downwardly directed, 99.7% of silicon nitride gel was removed.

It can be noted from the second test that, when the ultrasonic waves are applied, the cleaning efficiency is highly improved even though only deionized water is used. In addition, it can be noted that the ultrasonic waves applied to the upper surface of the semiconductor substrate are also applied to the SC1 solution supplied to the lower surface of the semiconductor substrate by passing through the semiconductor substrate.

As described above, the cleaning apparatus according to the present invention supplies first and second cleaning liquids to the edge section 900a and bottom section 900d of the semiconductor substrate being rotated and applies the ultrasonic waves to the first cleaning liquid supplied to the edge section of the semiconductor substrate. Accordingly, the impurities can be effectively removed from the edge, side and bottom sections of the semiconductor substrate.

In addition, the first and second nitrogen gas streams are supplied to a predetermined portion of the edge section, to which the first cleaning liquid is supplied, so the first cleaning liquid can be prevented from moving into the center portion of the semiconductor substrate.

Furthermore, the first cleaning liquid separated from the semiconductor substrate caused by the rotation of the semiconductor substrate is moved toward the edge section or side section of the semiconductor substrate by means of the guide. Accordingly, the cleaning efficiency can be improved at the edge and side sections of the semiconductor substrate.

By effectively removing the impurities sticking to the edge, side and bottom sections of the semiconductor substrate, it may not be necessary to perform a photolithography process for cleaning a specific portion of the semiconductor substrate. Therefore, the manufacturing cost of the semiconductor device can be reduced and the productivity of the semiconductor device can be improved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. An apparatus for cleaning a semiconductor substrate having an edge section and a side section, the apparatus comprising:
    a chuck on which the semiconductor substrate can be mounted for rotating the semiconductor substrate;
    an upper nozzle assembly positioned, when the semiconductor substrate is mounted on the chuck, above the edge section of the semiconductor substrate to supply a cleaning liquid to the edge section of the semiconductor substrate for cleaning the edge section and the side section of the semiconductor substrate; and
    an ultrasonic wave generator positioned, when the semiconductor substrate is mounted on the chuck, above the edge section to apply ultrasonic waves to the cleaning liquid supplied to the edge section;
    wherein the upper nozzle assembly includes:
        a first nozzle for supplying the cleaning liquid to the edge section;
        a second nozzle spaced apart from the first nozzle in a direction of a center portion of the semiconductor substrate to supply a first nitrogen gas stream for primarily restricting the cleaning liquid supplied to the edge section from moving towards the center portion;
        a third nozzle spaced apart from the second nozzle in the direction of the center portion to supply a second nitrogen gas stream for secondarily restricting the cleaning liquid supplied to the edge section from moving towards the center portion; and
    wherein the third nozzle is inclined at an angle from the center portion toward the edge section when the semiconductor substrate is mounted on the chuck; and
    wherein the inclination of the third nozzle is smaller than an inclination of the second nozzle.

2. The apparatus as claimed in claim 1, wherein the chuck includes a rotating shaft, a plurality of rods radially connected to each other at an upper portion of the rotating shaft, and a plurality of clamps provided at ends of the rods to grip the semiconductor substrate.

3. The apparatus as claimed in claim 1, wherein the upper nozzle assembly includes a first line for supplying the cleaning liquid to the first nozzle, and a first valve installed in the first line to control a flow rate of the cleaning liquid supplied to the first nozzle.

4. The apparatus as claimed in claim 3, wherein the first nozzle is inclined at an angle of 30 to 60 degrees from the center portion of the semiconductor substrate toward the edge section when the semiconductor substrate is mounted on the chuck.

5. The apparatus as claimed in claim 3, wherein the upper nozzle assembly includes:
    a second line for supplying the first nitrogen gas to the second nozzle;
    a second valve installed in the second line to control a flow rate of the first nitrogen gas passing through the second line;
    a third line branched from the second line to supply the second nitrogen gas to the third nozzle; and
    a third valve installed in the third line to control a flow rate of the second nitrogen gas supplied to the third nozzle.

6. The apparatus as claimed in claim 1, wherein the upper nozzle assembly includes a guide for shielding the cleaning liquid separated from the semiconductor substrate caused by a rotation of the semiconductor substrate, the guide being positioned below the upper nozzle assembly and spaced a predetermined distance from the side section when the semiconductor substrate is mounted on the chuck.

7. The apparatus as claimed in claim 6, wherein the guide is inclined at an angle of 40 to 50 degrees with respect to the semiconductor substrate when the semiconductor substrate is mounted on the chuck.

8. The apparatus as claimed in claim 6, wherein the ultrasonic wave generator has a rod shape and extends through the guide and towards an upper portion of the edge section when the semiconductor substrate is mounted on the chuck.

9. The apparatus as claimed in claim 8 wherein the ultrasonic wave generator is spaced apart from the semiconductor substrate a distance of between about 1 and 3 mm when the semiconductor substrate is mounted on the chuck.

10. The apparatus as claimed in claim 1, further comprising a lower nozzle assembly provided below the semiconductor substrate for supplying a second cleaning liquid onto a bottom section of the semiconductor substrate to clean the bottom section of the semiconductor substrate when the semiconductor substrate is mounted on the chuck.

11. The apparatus as claimed in claim 10, wherein the lower nozzle assembly includes a nozzle for supplying the second cleaning liquid to the bottom section of the semiconductor substrate, a line for supplying the second cleaning liquid to the nozzle, and a valve installed in the line to control a flow rate of the second cleaning liquid supplied to the nozzle.

12. The apparatus as claimed in claim 1, further comprising driving means for driving the upper nozzle assembly and the ultrasonic wave generator radially with respect to the semiconductor substrate to control a cleaning range of the semiconductor substrate.

13. The apparatus as claimed in claim 1, wherein the inclination of the third nozzle is in the range of from 15 to 30 degrees.

14. An apparatus for cleaning a semiconductor substrate having an edge section and a side section, the apparatus comprising:

a chuck on which the semiconductor substrate can be mounted for rotating the semiconductor substrate;

an upper nozzle assembly positioned, when the semiconductor substrate is mounted on the chuck, above the edge section of the semiconductor substrate to supply a cleaning liquid to the edge section of the semiconductor substrate for cleaning the edge section and the side section of the semiconductor substrate; and an ultrasonic wave generator positioned, when the semiconductor substrate is mounted on the chuck, above the edge section to apply ultrasonic waves to the cleaning liquid supplied to the edge section;

wherein the upper nozzle assembly includes:

a first nozzle for supplying the cleaning liquid to the edge section;

a first line for supplying the cleaning liquid to the first nozzle;

a first valve installed in the first line to control a flow rate of the cleaning liquid supplied to the first nozzle;

a second nozzle spaced apart from the first nozzle in a direction of a center portion of the semiconductor substrate to supply a first nitrogen gas stream for primarily restricting the cleaning liquid supplied to the edge section from moving towards the center portion;

a second line for supplying the first nitrogen gas to the second nozzle;

a second valve installed in the second line to control a flow rate of the first nitrogen gas passing through the second line;

a third nozzle spaced apart from the second nozzle in the direction of the center portion to supply a second nitrogen gas stream for secondarily restricting the cleaning liquid supplied to the edge section from moving towards the center portion;

a third line branched from the second line to supply the second nitrogen gas to the third nozzle;

a third valve installed in the third line to control a flow rate of the second nitrogen gas supplied to the third nozzle; and wherein the second nozzle is inclined at an angle of 30 to 60 degrees from the center portion toward the edge section when the semiconductor substrate is mounted on the chuck; and wherein an inclination of the third nozzle is smaller than the inclination of the second nozzle.

15. An apparatus for cleaning a semiconductor substrate having an edge section and a side section, the apparatus comprising:

a chuck on which the semiconductor substrate can be mounted for rotating the semiconductor substrate;

an upper nozzle assembly positioned, when the semiconductor substrate is mounted on the chuck, above the edge section of the semiconductor substrate to supply a cleaning liquid to the edge section of the semiconductor substrate for cleaning the edge section and the side section of the semiconductor substrate; and an ultrasonic wave generator positioned, when the semiconductor substrate is mounted on the chuck, above the edge section to apply ultrasonic waves to the cleaning liquid supplied to the edge section;

wherein the upper nozzle assembly includes:

a first nozzle for supplying the cleaning liquid to the edge section;

a first line for supplying the cleaning liquid to the first nozzle;

a first valve installed in the first line to control a flow rate of the cleaning liquid supplied to the first nozzle;

a second nozzle spaced apart from the first nozzle in a direction of a center portion of the semiconductor substrate to supply a first nitrogen gas stream for primarily restricting the cleaning liquid supplied to the edge section from moving towards the center portion;

a second line for supplying the first nitrogen gas to the second nozzle;

a second valve installed in the second line to control a flow rate of the first nitrogen gas passing through the second line;

a third nozzle spaced apart from the second nozzle in the direction of the center portion to supply a second nitrogen gas stream for secondarily restricting the cleaning liquid supplied to the edge section from moving towards the center portion;

a third line branched from the second line to supply the second nitrogen gas to the third nozzle; and a third valve installed in the third line to control a flow rate of the second nitrogen gas supplied to the third nozzle; and wherein the third nozzle is inclined at an angle of 15 to 30 degrees from the center portion toward the edge section when the semiconductor substrate is mounted on the chuck; and wherein the inclination of the third nozzle is smaller than an inclination of the second nozzle.

* * * * *